(12) United States Patent
Lu et al.

(10) Patent No.: US 7,531,411 B2
(45) Date of Patent: May 12, 2009

(54) APPARATUS AND METHOD FOR A NON-VOLATILE MEMORY STRUCTURE COMPRISING A MULTI-LAYER SILICON-RICH, SILICON NITRIDE TRAPPING LAYER

(75) Inventors: Chi-Pin Lu, Hsinchu (TW); Ling-Wuu Yang, Hsunchu (TW); Kuang-Chao Chen, Taipei (TW)

(73) Assignee: Macronix International Co., Ltd. (TW)

( * ) Notice: Subject to any disclaimer, the term of this patent is extended or adjusted under 35 U.S.C. 154(b) by 325 days.

(21) Appl. No.: 11/248,507

(22) Filed: Oct. 12, 2005

(65) Prior Publication Data

US 2007/0082447 A1 Apr. 12, 2007

(51) Int. Cl.
*H01L 21/336* (2006.01)
*H01L 29/788* (2006.01)

(52) U.S. Cl. .................. 438/264; 438/591; 438/594; 438/775; 257/321; 257/324

(58) Field of Classification Search ............ 438/264, 438/261, 776, 591–594, 775; 257/324, 321
See application file for complete search history.

(56) References Cited

U.S. PATENT DOCUMENTS

| | | | | |
|---|---|---|---|---|
| 4,870,470 A | * | 9/1989 | Bass et al. | 257/324 |
| 6,001,713 A | * | 12/1999 | Ramsbey et al. | 438/520 |
| 6,406,960 B1 | * | 6/2002 | Hopper et al. | 438/261 |
| 6,709,928 B1 | * | 3/2004 | Jenne et al. | 438/264 |
| 7,172,792 B2 | * | 2/2007 | Wang et al. | 427/255.393 |
| 2003/0077864 A1 | * | 4/2003 | Wakamiya | 438/257 |
| 2004/0043570 A1 | * | 3/2004 | Fujisaki et al. | 438/287 |

* cited by examiner

*Primary Examiner*—Kevin M Picardat
(74) *Attorney, Agent, or Firm*—Baker & McKenzie LLP

(57) ABSTRACT

A non-volatile memory structure comprises a trapping layer that includes a plurality of silicon-rich, silicon nitride layers. Each of the plurality of silicon-rich, silicon nitride layers can trap charge and thereby increase the density of memory structures formed using the methods described herein. In one aspect, the plurality of silicon-rich, silicon nitride layers are fabricated by converting an amorphous silicon layer by remote plasma nitrogen (RPN).

18 Claims, 9 Drawing Sheets

APPARATUS AND METHOD FOR A NON-VOLATILE MEMORY STRUCTURE COMPRISING A MULTI-LAYER SILICON-RICH, SILICON NITRIDE TRAPPING LAYER

BACKGROUND

1. Field of the Invention

The invention relates generally to non-volatile semiconductor memory devices, and more particularly to a non-volatile semiconductor memory structure comprising a multi-trapping layer comprising a plurality of silicon-rich, silicon nitride charge-trapping layers.

2. Background of the Invention

Electrically erasable programmable read only memories (EEPROM) rely on charge injection and removal to establish a stored logic state. This is in contrast to conventional dynamic random access memory (DRAM), which requires periodic refresh pulses in order to maintain the logic state in a capacitive storage element. Conventional EEPROM devices generally comprise a field effect transistor (FET), wherein the gate electrode is formed over a portion of the silicon substrate between two diffusion regions. The diffusion regions act as the source and gate for the FET. The gate electrode in conventional EEPROM devices comprises some form of injection layer into which charges are injected from a channel induced in the silicon substrate below the gate electrode.

In practice, it is difficult to precisely control the extent of charge injection from the induced channel region. A silicon oxide layer separating the channel region from the injection layer must be thin enough to allow charge transfer and yet thick enough to allow the injection layer to retain and store the injected charge. These characteristics are very sensitive to changes in the thickness and/or stoichiometry of the oxide film.

In order to surmount these difficulties, researchers have attempted to construct EEPROM cells that do not rely upon charge injection from an induced channel region. One such device makes use of a non-conductive charge-trapping structure formed from silicon-rich, silicon nitride ($Si_3N_4$). The silicon-rich, silicon nitride-trapping layer of one such device is fabricated using LPCVD with different flow rate ratios (R) of dichlorosilane and ammonia.

Such a device provides a non-conductive charge-trapping structure that is not dependent on carrier injection in order to establish a stored logic state. Further, such a device provides a charge-trapping structure that is not overly sensitive to small variations and thickness and/or stoichiometry; however, a drawback to such device is that it only comprises a single trapping layer and therefore can only store a single logic state, orbit.

SUMMARY

A non-volatile memory structure comprises a trapping layer that includes a plurality of silicon-rich, silicon nitride charge trapping layers. Each of the plurality of silicon-rich, silicon nitride layers can trap charge and thereby increase the density of memory devices formed using the non-volatile memory structure described herein.

In one aspect, the plurality of silicon-rich, silicon nitride layers are fabricated by converting an amorphous silicon layer via remote plasma nitrogen (RPN).

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

It has been shown that silicon nitride charge-trapping layers deposited by LPCVD using various ratios (R) of dichlorosilane and ammonia can produce a charge-trapping layer that can be use in non-volatile memory cells. Specifically, it has been shown that low additional silicon content, silicon-rich, silicon nitride films exhibit appreciably enhanced trapping characteristics as compared to stoichiometric silicon nitride, without exhibiting appreciably enhanced conductivity characteristics.

Figure 1:
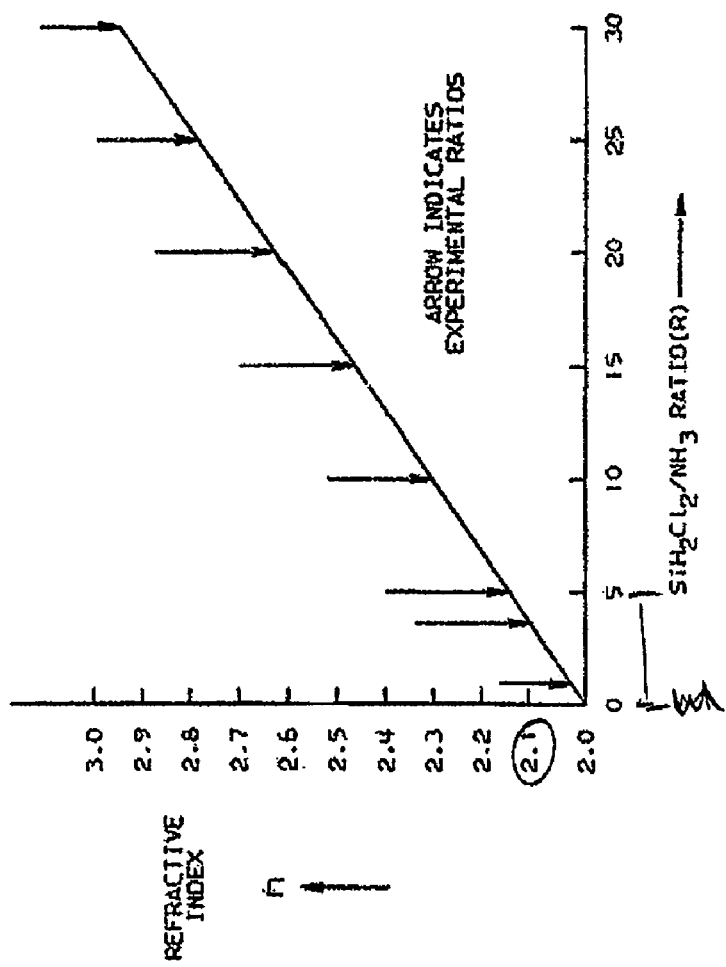
FIG. 1 is graph illustrating the relationship between a flow ratio (R) of $SiH_2Cl_2/NH_3$ used to produce a silicon-rich, silicon nitride film and the refractive index for the film thus generated; (prior art)

It has been shown that a flow rate (R) that results in a silicon nitride film with a refractive index around 2.1 produces the low additional silicon content, silicon-rich, silicon nitride films exhibiting the enhanced trapping characteristics and without appreciably enhanced conductivity characteristics that prove useful in non-volatile memory cells. As illustrated in FIG. 1, a ratio (R) in the range of 3 to 5 can produce a silicon nitride layer with a refractive index in the range of 2.1.

Figure 2:
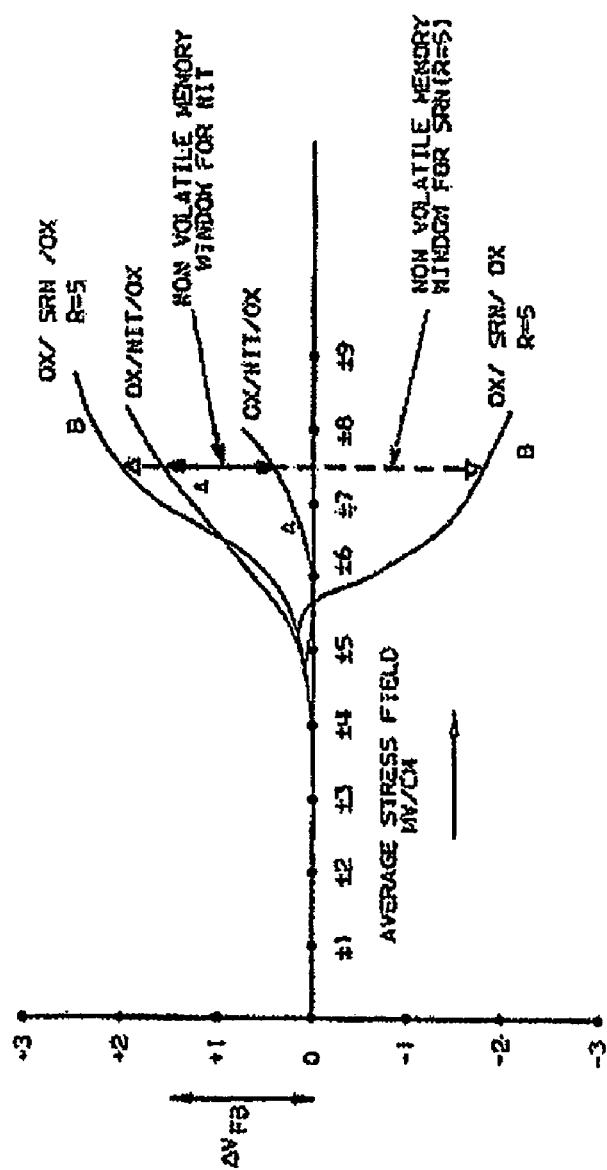
FIG. 2 is graph illustrating the flat band (FB) shift produced fro a silicon, nitride film at an applied electric field, in MV/cm, of either polarity when stressed for a fixed time duration at any field strength; (prior art)

FIG. 2 is a graph illustrating a plot of the flat band (FB) shift produced at an applied electric field, in MV/cm, of either polarity when stressed for a fixed time duration at any field strength. The test structure used to produce the graph of FIG. 2 consisted of 70 A of thermal silicon oxide grown on a P-type silicon substrate, 100 A of deposited nitride or silicon-rich, silicon nitride (R=0.1 and 5), 45 A of oxide thermally grown on the silicon nitride or silicon-rich, silicon nitride layer, and a 1 micron layer of aluminum. The graph illustrates that the stoichiometric silicon nitride exhibits a positive flat band shift for E-fields of either polarity, and that the difference between the two shifts is only approximately 1.5 volts at $E=\pm 7.5\times 10^6$ v/cm. The silicon-rich, silicon nitride film of R=5, however, exhibits positive and negative flat band shifts as a function of the E-field polarity. Thus, both holes and electrons are being trapped. The difference between the two voltage shifts is approximately between 3.5V at $E=7.5\times10^6$ V/cm. This difference in flat band voltage shift is addition to provide a manufacturable EEPROM storage cell.

Thus, what has been shown by previous experiments is that silicon-rich, silicon nitride films with an associated refractive index in the range of 2.1, e.g. 2.1-2.17, will provide the charge storage function normally provided by polysilicon floating gates of EEPROM cells. In general, it has been shown that silicon-rich, silicon nitride films having a refractive index between approximately 2 and 2.4 will provide appreciably enhanced charge-trapping without providing appreciably enhanced conduction.

As mentioned, a drawback to conventional devices that use silicon-rich, silicon nitride films for charge trapping is that only a single-charge trapping layer can be formed, which limits the charge-trapping density.

The memory cell described herein uses RPN to convert amorphous silicon into a silicon-rich, silicon nitride trapping layer; however, the trapping layer can actually comprise a plurality of silicon-rich, silicon nitride layers. Each trapping layer can be used to trap charge and therefore increase the trapping density.

Figure 3:
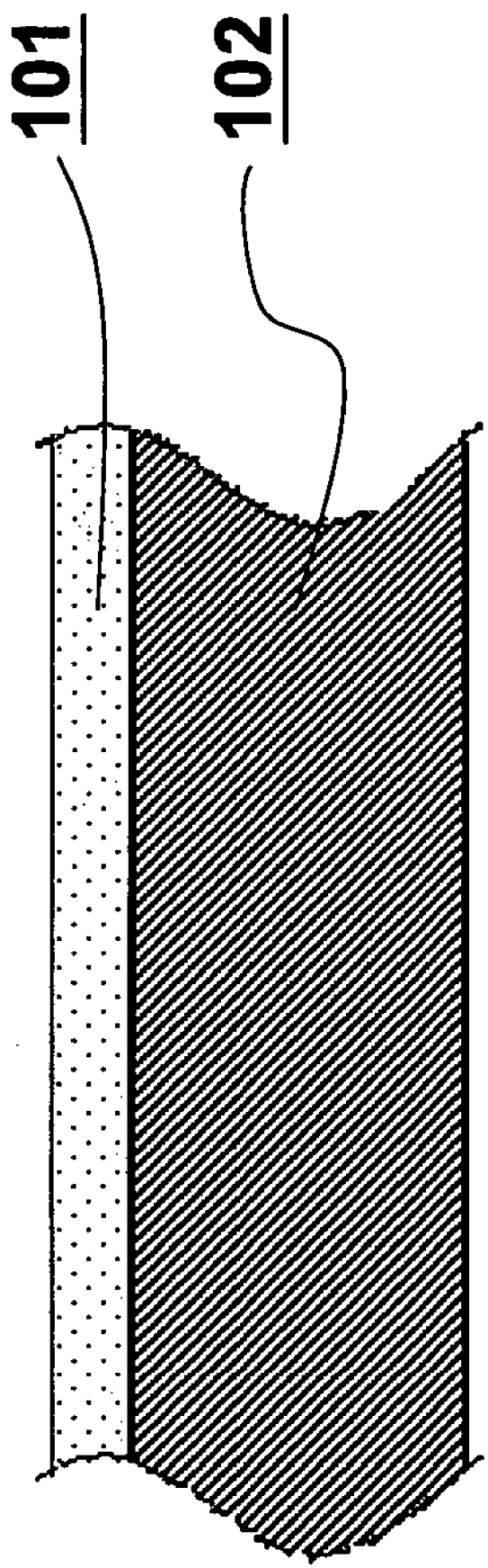
FIG. 3 is a diagram illustrating a first step in forming a multi-layer trapping layer in accordance with one embodiment.
Figure 4:
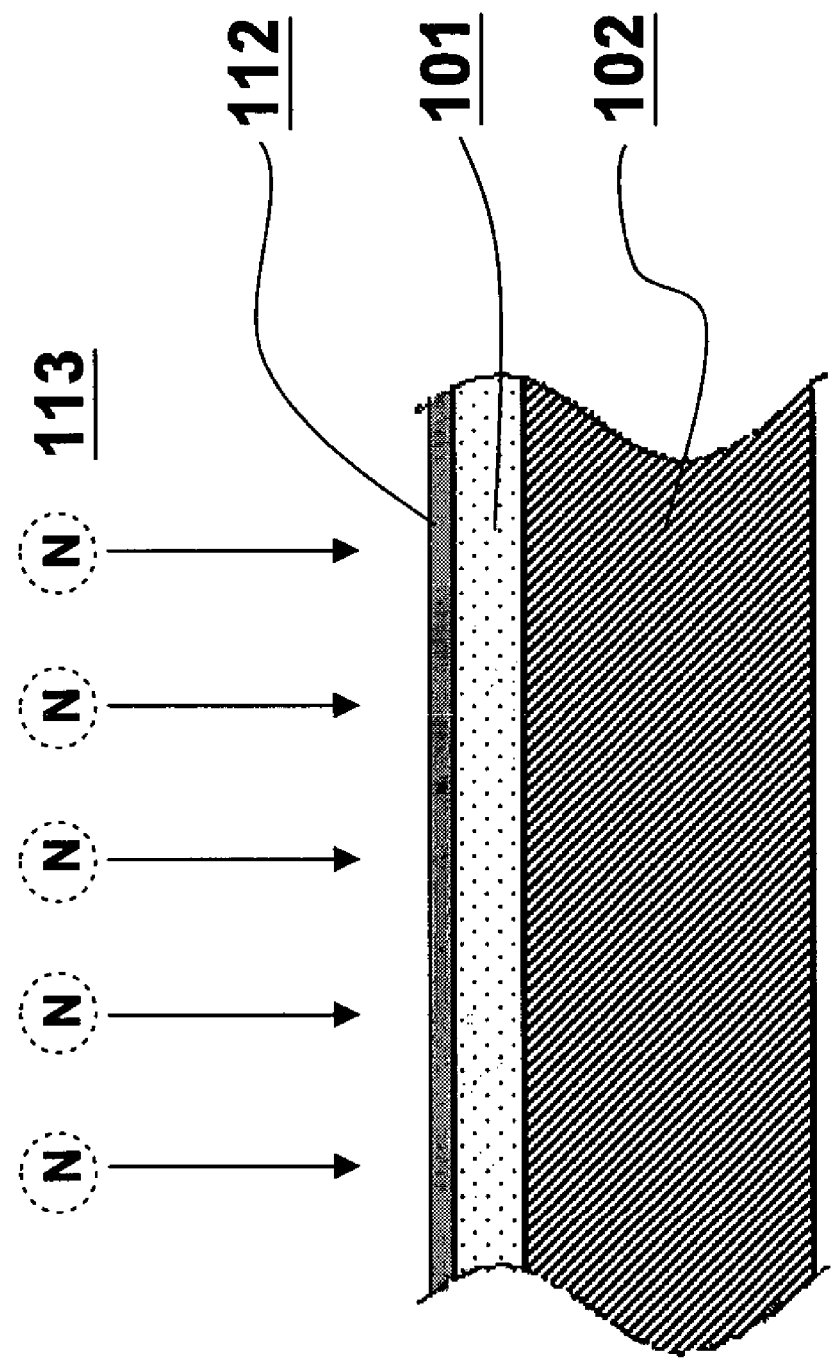
FIG. 4 is a diagram illustrating a second step in forming a multi-layer trapping layer in accordance with one embodiment.
Figure 5:
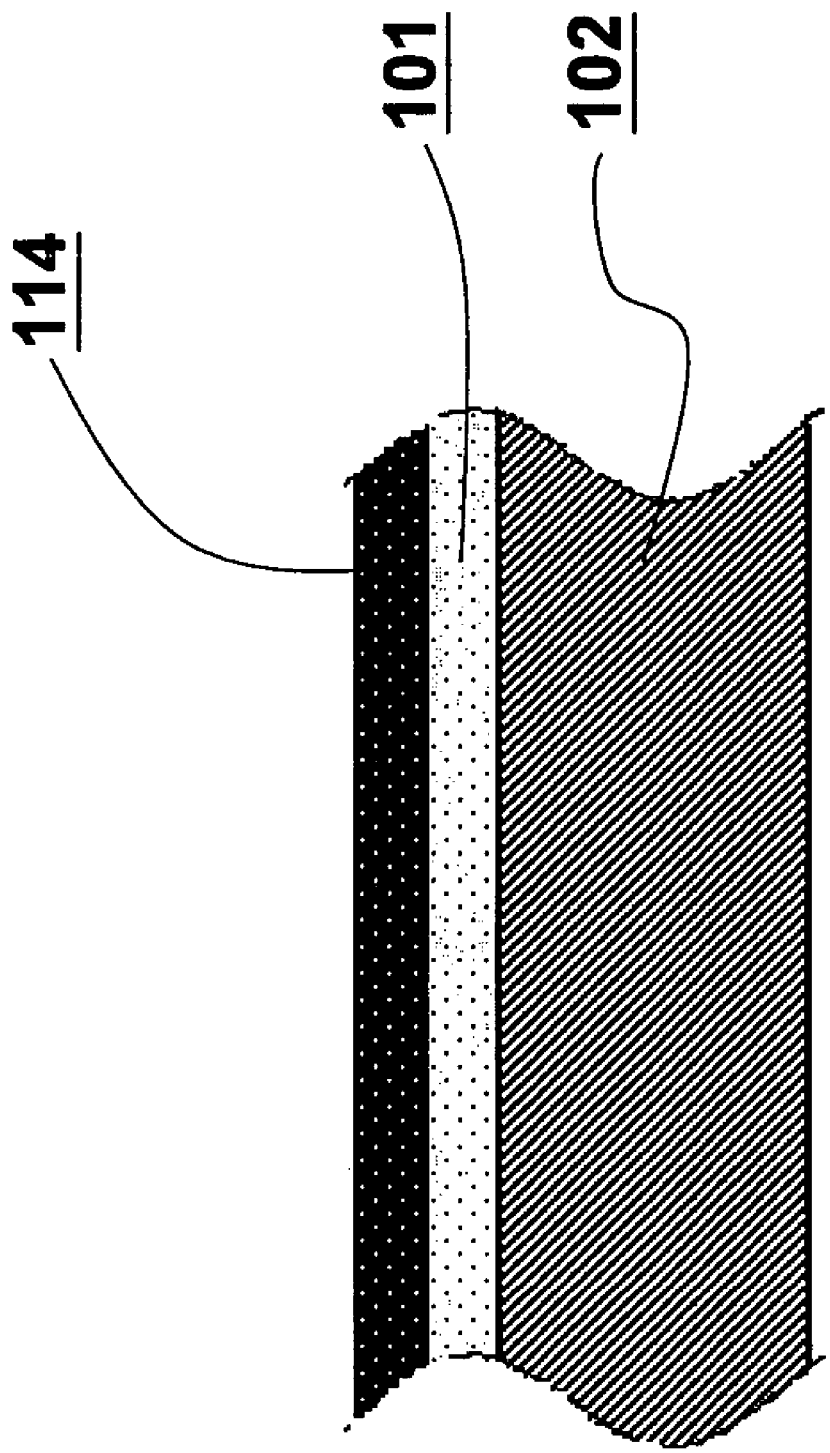
FIG. 5 is a diagram illustrating a third step in forming a multi-layer trapping layer in accordance with one embodiment.

FIGS. 3-5 can be used to illustrate the process for fabricating a trapping layer comprising multiple silicon-rich, silicon nitride layers. In FIG. 3, a silicon oxide ($SiO_2$) layer 101 can be grown on a silicon substrate 102. Silicon oxide layer 101 can, for example, be thermally grown on silicon substrate 102. In FIG. 4, an amorphous silicon layer 112 can be deposited on top of silicon oxide layer 101. For example, in one embodiment, an amorphous silicon layer 112 can comprise 5 A to 25 A of amorphous silicon deposited by $SiH_4$ with gas flow equal to 16 sccm at 580° C. and 200 Torr for 10 to 20 seconds.

Once amorphous silicon layer 112 is deposited, it can be converted into a silicon-rich, silicon nitride layer via RPN. RPN techniques are well documented and it will be appreciated that any suitable RPN technique can be used to convert amorphous silicon layer 112 into a silicon-rich, silicon nitride layer. For example, thermal RPN techniques using microwave plasma to excite the nitrogen molecules into the process environment can be used as can high-density plasma RPN techniques.

In one embodiment, amorphous silicon layer 112 is exposed to RPN radicals 113 with Ar equal to 1200 sccm, and $N_2$ equal to 50 to 100 sccm, at 400° C. and 1.6 Torr for 150 to 300 seconds. By applying RPN radicals 113 on layer 112, amorphous silicon layer 112 can be converted to a silicon-rich, silicon nitride layer 114 as illustrated in FIG. 5. This silicon-rich, silicon nitride layer 114 can then be used to trap charge in a non-volatile memory structure as described below.

Figure 6:
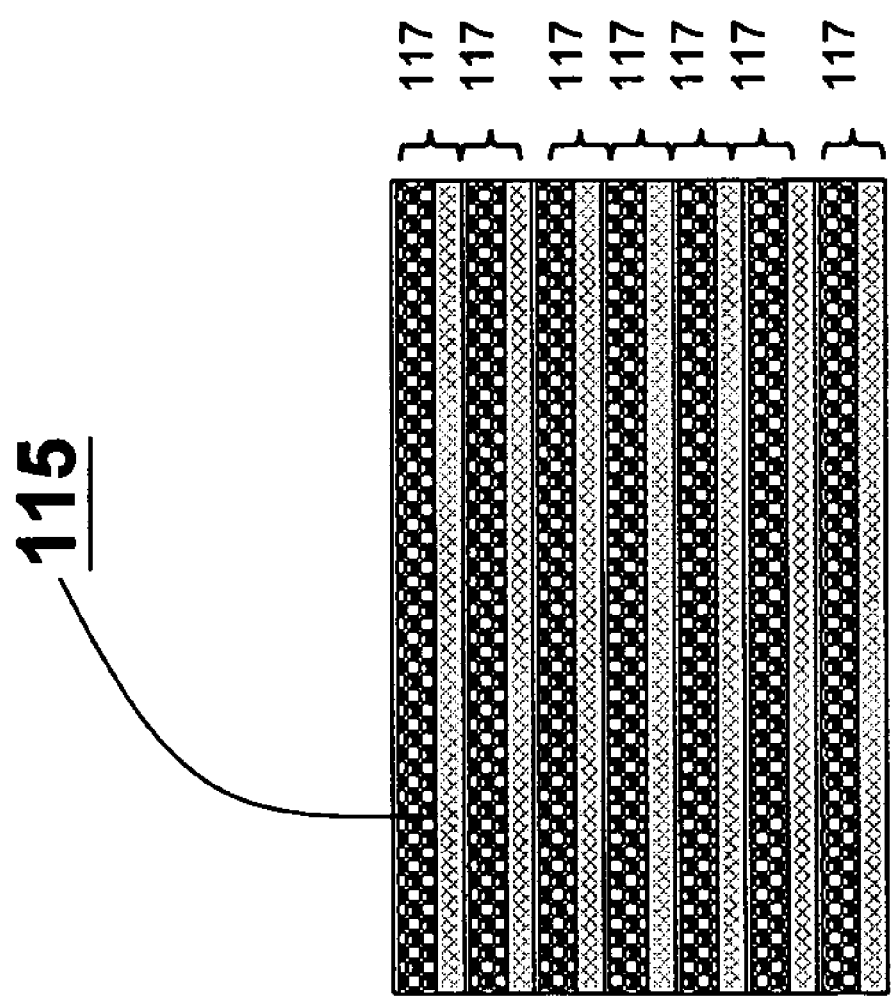
FIG. 6 is a diagram illustrating a multi-layer trapping layer formed using the method of FIGS. 3-5.

By implementing the process illustrated in FIGS. 4 and 5 repeatedly, i.e., growing a silicon oxide layer 101, depositing an amorphous silicon layer 112, and exposing the amorphous silicon layer to RPN radical 113 in order to convert the amorphous silicon layer into a silicon-rich, silicon nitride layer 114, a multi-layer structure can be generated as illustrated in FIG. 6.

As illustrated in FIG. 6, a plurality of silicon-rich, silicon nitride layers 117 can be generated by repeating the process described above. The stoichiometry of trapping layers 117 would generally not be uniform from layer to layer. As a result, silicon-rich, silicon nitride can exist on the upper regions of layers 117 that can provide sufficient recess silicon for charge-trapping in each interface. As a result, a multi-trapping layer 115 for use in a non-volatile memory device comprising a high density of deep level trapping layers can be obtained using the methods described herein.

Figure 7:
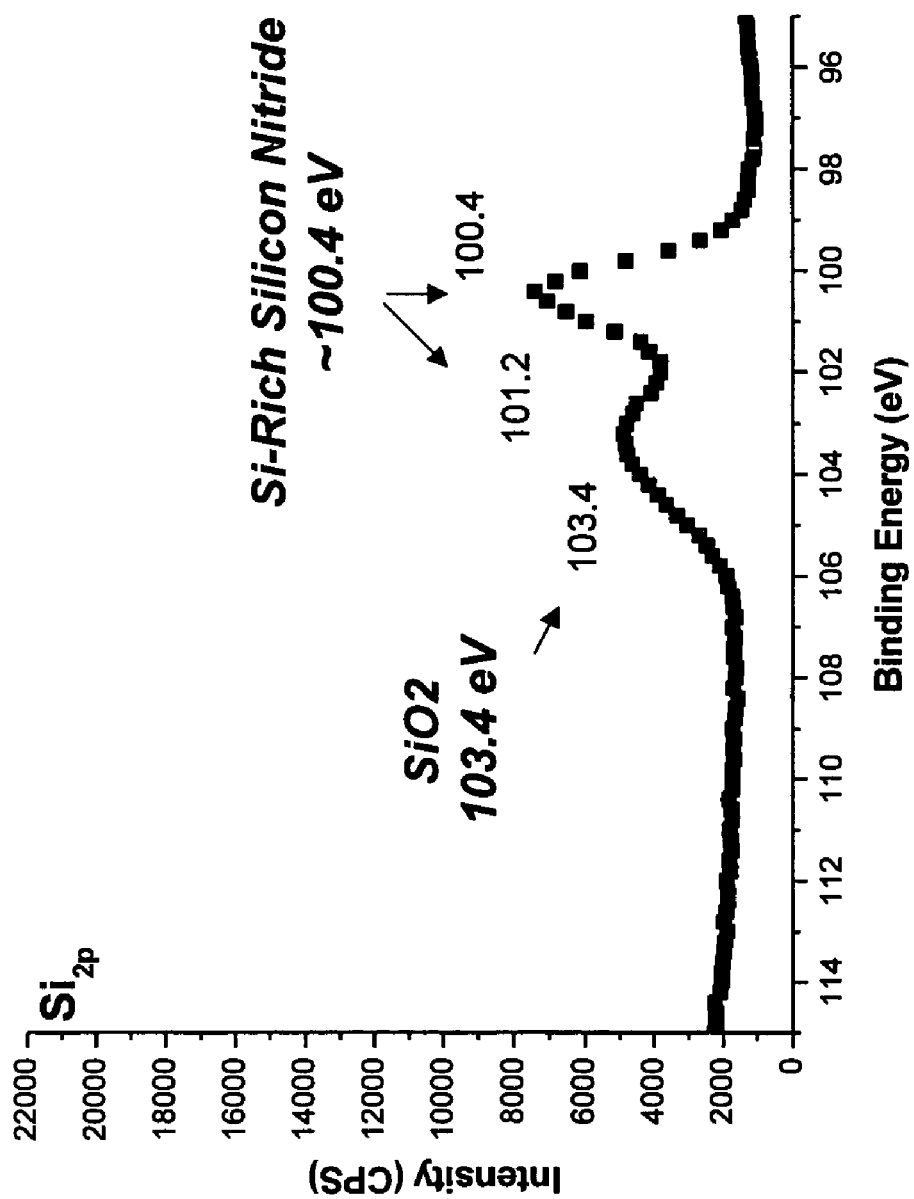
FIG. 7 is a graph of the Si(2p) binding energy for a silicon-rich, silicon nitride trapping layer formed using the process of FIGS. 3-5.

Using the method described herein a silicon-rich, silicon nitride film with a refractive index in the range of 2.3 can be obtained. As mentioned above, silicon-rich, silicon nitride layers with refractive indexes in this range prove useful for storing charge sufficient for EEPROM, or non-volatile memory type applications. Further, the silicon-rich, silicon nitride layer produced using the methods described herein produces a multi-Si binding energy as illustrated in FIG. 7. FIG. 7 illustrates the binding energy for silicon oxide as well as multiple binding energies for the silicon-rich, silicon nitride. The two binding energies illustrated in FIG. 7 are for Si(2p).

Figure 8:
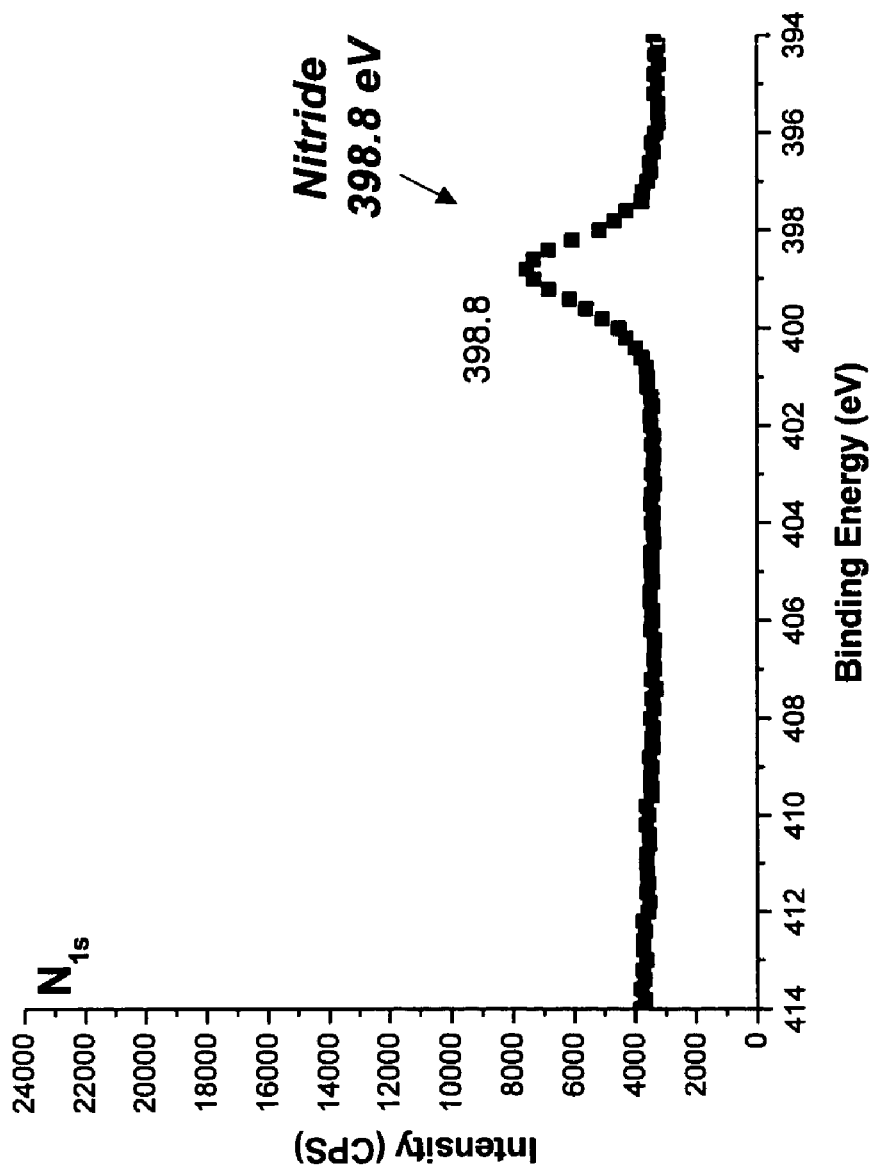
FIG. 8 is a graph of the N(1s) binding energy for a silicon-rich, silicon nitride trapping layer formed using the process of FIGS. 3-5.

FIG. 8 is a diagram illustrating the binding energy for silicon-rich, silicon nitride produced using the methods described herein. The binding energy illustrated in FIG. 8 is the binding energy of N(1s).

The thickness of multi-trapping layer 115 can effect whether layer 115 will have an index of refraction in the correct range. Experiments have shown that a thickness of between 100 A and 200 A can produce an index of refraction greater than approximately 2.1, which can be sufficient for non-volatile memory applications. For example, a thickness of approximately 100 A, with a silicon Oxide thickness of approximately 1200 A can produce an index of refraction of greater than 2.1, e.g., about 2.3.

This can for example correspond to a multi-trapping layer film 115 comprising 10 silicon-rich, silicon nitride layers 117, each with a thickness of about 10 A. Thus, thicknesses in the range of 10 A to 20 A for silicon-rich, silicon nitride layers 117 can produce a film 115 with the correct index of refraction.

Figure 9:
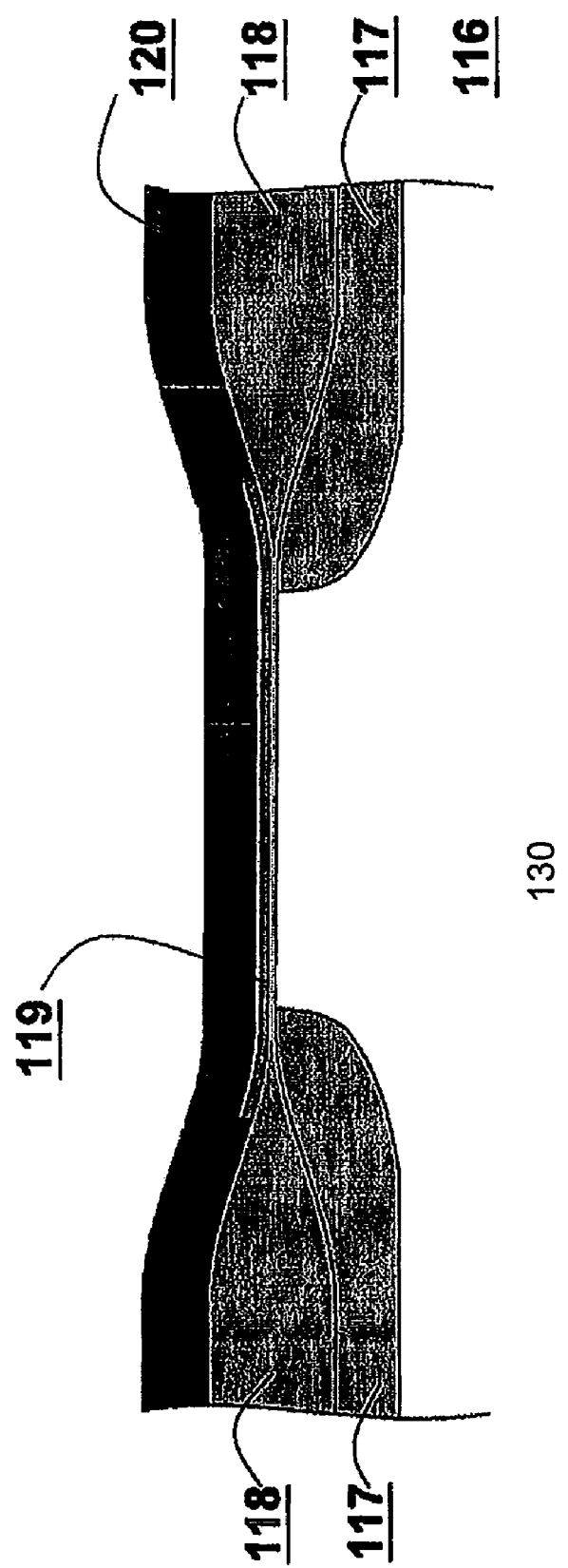
FIG. 9 is a diagram illustrating a non-volatile memory structure comprising a multi-layer trapping layer such as that illustrated in FIG. 6.

FIG. 9 is a diagram illustrating an example of non-volatile memory structure with a multi-trapping layer 119 produced in accordance with the methods described above. As can be seen, non-volatile memory structure 130 comprises a silicon substrate 116. Drain/source regions 117 can then be implanted in substrate 116. A silicon oxide layer 118 can then be grown over substrate 116. A multi-trapping layer 119 can then be formed using repeated RPN cycles as described above, and poly silicon layer 120 can then be deposit on top of structure 119.

Thus, multi-trapping layer 119 can comprise multiple silicon rich, silicon nitride layers as in FIG. 6. These multiple layers can provide a high density of deep level trappings in contrast to conventional memory devices that use a single silicon-rich, silicon nitride trapping layer.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for producing a multi-trapping layer, non-volatile memory structure, comprising:
    (a) depositing an amorphous silicon layer;
    (b) exposing the amorphous silicon layer to remote plasma nitrogen radicals;
    (c) converting the amorphous silicon layer to a silicon-rich, silicon nitride layer; and
    repeating the steps (a) to (c) to produce a second silicon-rich, silicon nitride layer.

2. The method of claim 1, further comprising repeating the steps (a) to (c) a plurality of times to produce a plurality of silicon-rich, silicon nitride layers.

3. The method of claim 1, wherein the amorphous silicon layer is between 5 A and 25 A.

4. The method of claim 1, wherein the amorphous silicon layer is deposited by SiH4 or with gas flow equal to 16 sccm at 580° C. and 200 Torr for a period of time.

5. The method of claim 4, wherein the period of time is between about 10 and about 20 seconds.

6. The method of claim 1, wherein the remote plasma nitrogen radicals are generated with Ar equal to 1,200 sccm, and $N_2$ equal to about 50 to about 100 sccm, at 400° C. and 1.6 Torr for a certain period of time.

7. The method of claim 6, wherein the certain period of time is from about 150 to about 300 seconds.

8. The method of claim 7, wherein the amorphous silicon layer is deposited on a silicon substrate, and wherein the method further comprises implanting a source and drain region in the silicon substrate.

9. A non-volatile memory structure formed by process of claim 1.

10. A non-volatile memory structure formed by process of claim 2.

11. A non-volatile memory structure, comprising:
   a multi-trapping layer comprising a plurality of silicon-rich, silicon nitride layers:
   a substrate;
   a drain implanted in the substrate;
   a source implanted in the substrate; and
   wherein the multi-trapping layer has an index of refraction of greater than 2.0.

12. The non-volatile memory structure of claim 11, further comprising a silicon oxide layer formed between the multi-trapping layer and the substrate.

13. The non-volatile memory structure of claim 11, wherein the multi-trapping layer has an index of refraction of about 2.3.

14. The non-volatile memory structure of claim 11, wherein the multi-trapping layer has an index of refraction between about 2.0 and about 2.4.

15. The non-volatile memory structure of claim 11, wherein the thickness of the multi-trapping layer is approximately 100 A.

16. The non-volatile memory structure of claim 11, wherein the thickness of the multi-trapping layer is approximately between about 100 A and about 200 A.

17. The non-volatile memory structure of claim 11, wherein the thickness of each layer comprising the multi-trapping layer is about 10 A.

18. The non-volatile memory structure of claim 11, wherein the thickness of each of the layers comprising the multi-trapping layer is between about 10 A and 20 A.

* * * * *